US012283640B2

(12) United States Patent
Suh et al.

(10) Patent No.: US 12,283,640 B2
(45) Date of Patent: Apr. 22, 2025

(54) BYPASS DIODE ASSEMBLIES FOR A SOLAR CELL ARRAY

(71) Applicant: THE BOEING COMPANY, Arlington, VA (US)

(72) Inventors: Charles Hyunsang Suh, La Palma, CA (US); Dante Michael Caruso, El Segundo, CA (US)

(73) Assignee: THE BOEING COMPANY, Arlington, VA (US)

( * ) Notice: Subject to any disclaimer, the term of this patent is extended or adjusted under 35 U.S.C. 154(b) by 0 days.

(21) Appl. No.: 18/297,517

(22) Filed: Apr. 7, 2023

(65) Prior Publication Data
US 2024/0339549 A1 Oct. 10, 2024

(51) Int. Cl.
*H01L 31/044* (2014.01)
*H01L 31/05* (2014.01)
*H01L 31/18* (2006.01)

(52) U.S. Cl.
CPC ........ *H01L 31/044* (2014.12); *H01L 31/0504* (2013.01); *H01L 31/188* (2013.01)

(58) Field of Classification Search
CPC . H01L 31/044; H01L 31/0443; H01L 31/188; H01L 31/0504
See application file for complete search history.

(56) References Cited

U.S. PATENT DOCUMENTS

| | | | |
|---|---|---|---|
| 4,537,838 A | 8/1985 | Jetter et al. | |
| 4,577,051 A * | 3/1986 | Hartman | H01L 31/044 |
| | | | 136/244 |
| 4,860,509 A | 8/1989 | Laaly et al. | |
| 6,215,083 B1 | 4/2001 | Glenn | |
| 6,218,606 B1 * | 4/2001 | Morizane | H01L 31/044 |
| | | | 257/443 |
| 6,315,575 B1 | 11/2001 | Kajimoto | |
| 6,660,930 B1 | 12/2003 | Gonsiorawski | |
| 8,636,198 B1 | 1/2014 | Linderman et al. | |
| 9,087,948 B1 | 7/2015 | Frolov et al. | |

(Continued)

FOREIGN PATENT DOCUMENTS

| | | | |
|---|---|---|---|
| DE | 102011105019 B4 * | 1/2023 | ........... H01L 31/044 |
| WO | WO-2018210283 A1 * | 11/2018 | ........... H01L 31/044 |

OTHER PUBLICATIONS

DE-102011105019-B4 English machine translation (Year: 2023).*
WO-2018210283-A1 English machine translation (Year: 2018).*

*Primary Examiner* — Andrew J Golden
(74) *Attorney, Agent, or Firm* — Moore IP Law

(57) ABSTRACT

A bypass diode assembly includes a plurality of diodes and a plurality of interconnects coupled to the plurality of diodes. Functionality of the plurality of diodes to prevent current limiting of a solar cell string that the bypass diode assembly is coupled to is not dependent on back metal of solar cells of the solar cell string. Each interconnect includes one or more relief features. A first terminal of a first diode of the plurality of diodes is physically and electrically coupled directly to a first end of a first interconnect of the plurality of interconnects. A second terminal of a second diode of the plurality of diodes is physically and electrically coupled directly to a second end of the first interconnect. Also, a first end of a second interconnect of the plurality of interconnects is physically and electrically coupled directly to a first terminal of the second diode.

20 Claims, 6 Drawing Sheets

(56) References Cited

U.S. PATENT DOCUMENTS

| | | |
|---|---|---|
| 9,653,632 B1 | 5/2017 | Beitman |
| 9,815,575 B2 | 11/2017 | Levy |
| 2004/0016454 A1 | 1/2004 | Murphy et al. |
| 2011/0108084 A1 | 5/2011 | Tisler et al. |
| 2011/0284052 A1* | 11/2011 | Croft .................. H01L 31/0504 |
| | | 156/308.2 |
| 2012/0060895 A1* | 3/2012 | Rubin .................. H01L 31/048 |
| | | 136/246 |
| 2012/0074576 A1* | 3/2012 | Linderman ......... H01L 31/0504 |
| | | 257/773 |
| 2012/0234388 A1* | 9/2012 | Stancel ............... H01L 31/0504 |
| | | 257/E31.11 |
| 2013/0019919 A1 | 1/2013 | Hoang et al. |
| 2014/0213013 A1 | 7/2014 | Britt et al. |
| 2014/0230880 A1 | 8/2014 | Sakuma et al. |
| 2015/0102296 A1 | 4/2015 | Kim et al. |
| 2015/0144173 A1 | 5/2015 | Hoang et al. |
| 2015/0171788 A1 | 6/2015 | Bunea |
| 2015/0380588 A1 | 12/2015 | Lasich |
| 2016/0118935 A1 | 4/2016 | Posbic et al. |
| 2017/0012154 A1 | 1/2017 | Aiken et al. |
| 2017/0040479 A1* | 2/2017 | Tourino .............. H01L 31/0504 |
| 2017/0086291 A1 | 3/2017 | Cotton et al. |
| 2017/0093326 A1 | 3/2017 | Boulanger et al. |
| 2017/0133983 A1 | 5/2017 | Moslehi et al. |
| 2017/0297749 A1 | 10/2017 | Steele et al. |
| 2018/0062011 A1 | 3/2018 | Crist |
| 2018/0158970 A1 | 6/2018 | Yoon et al. |
| 2019/0140123 A1 | 5/2019 | Inaba et al. |
| 2019/0165189 A1 | 5/2019 | Corneille et al. |
| 2019/0288137 A1 | 9/2019 | Waterman et al. |
| 2019/0288638 A1 | 9/2019 | Crocker et al. |
| 2019/0319146 A1 | 10/2019 | Bardfield et al. |

\* cited by examiner

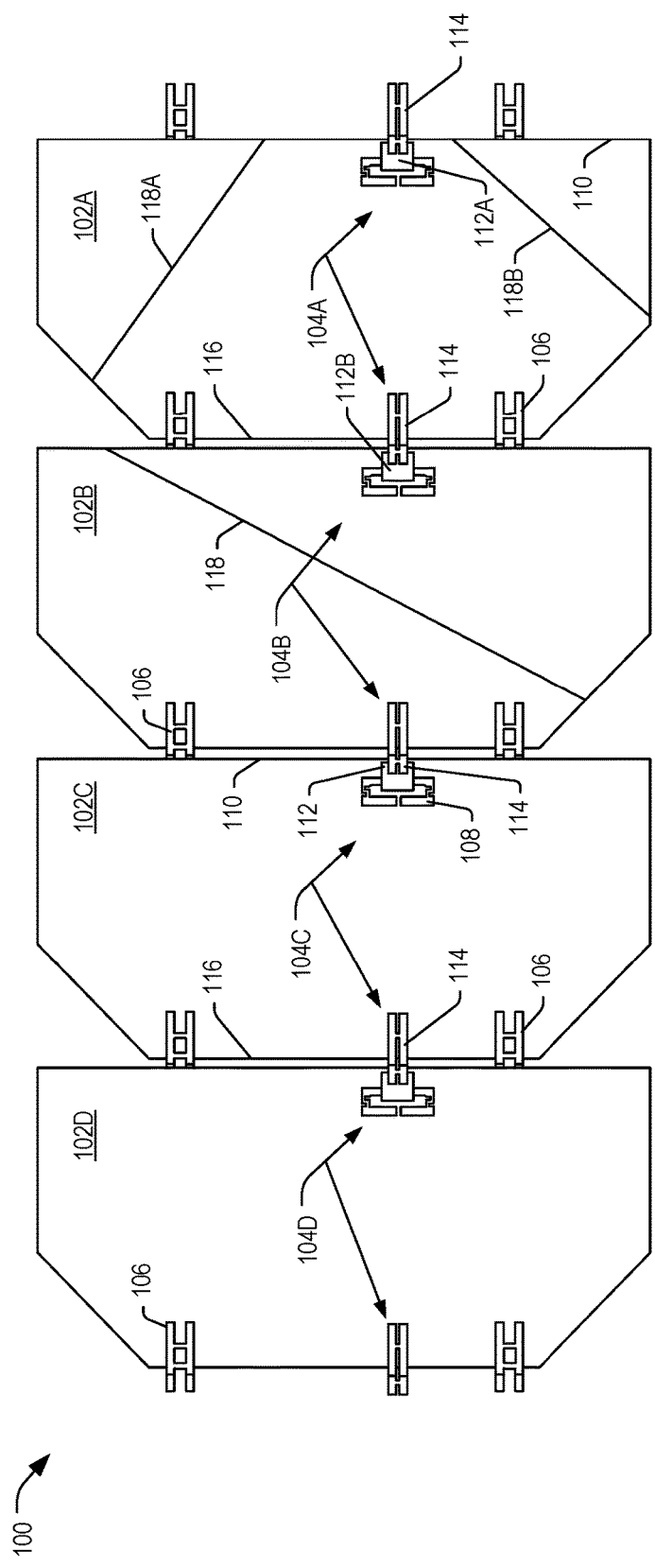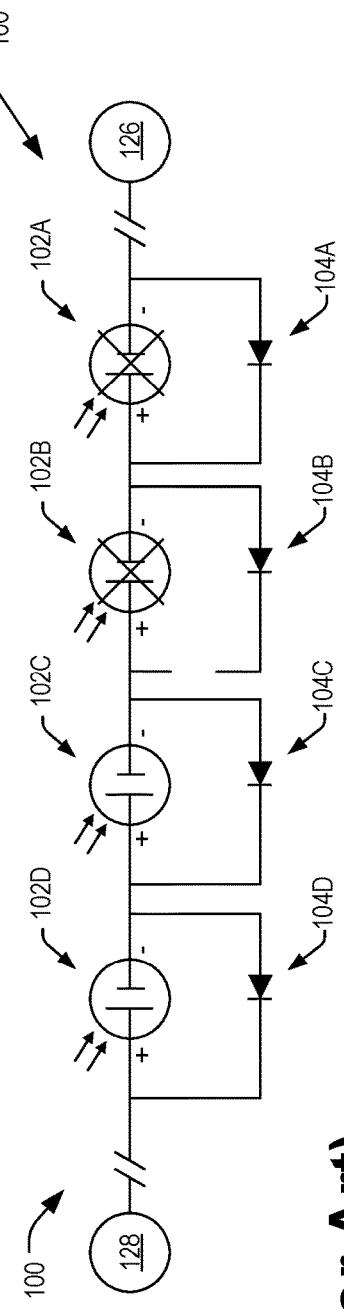
FIG. 1A (Prior Art)
FIG. 1B (Prior Art)

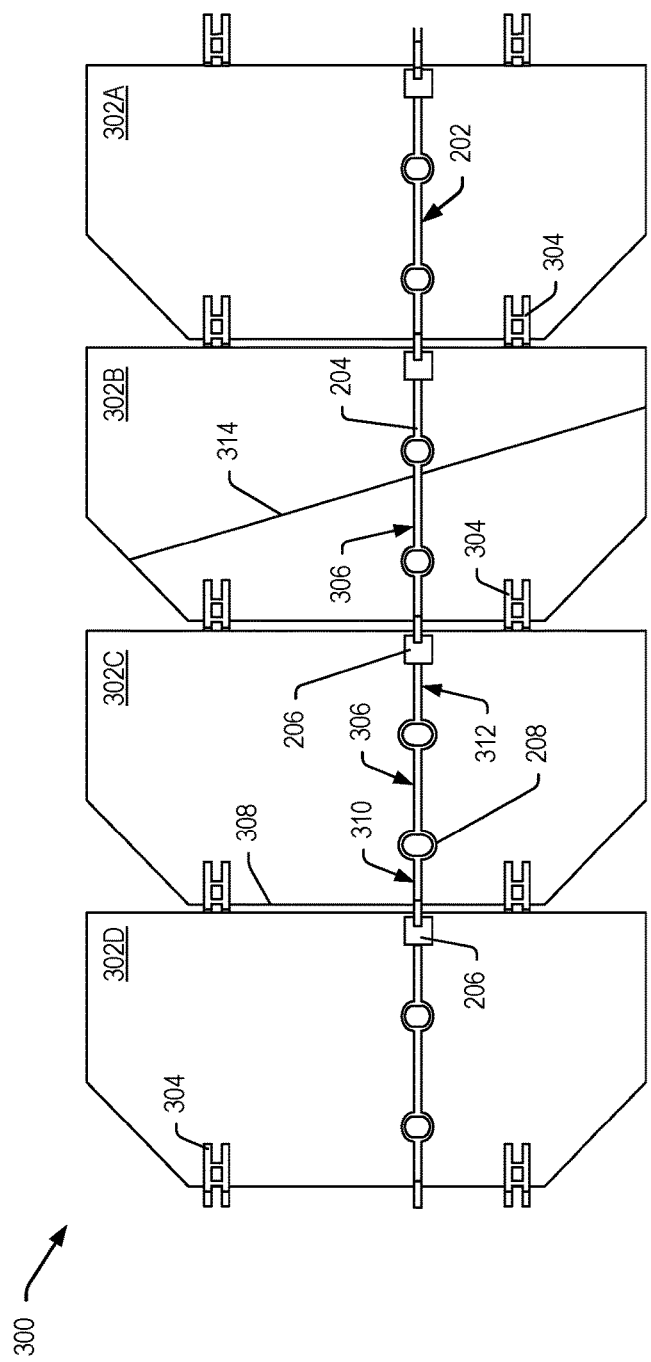
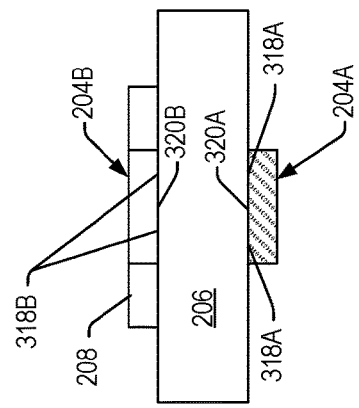

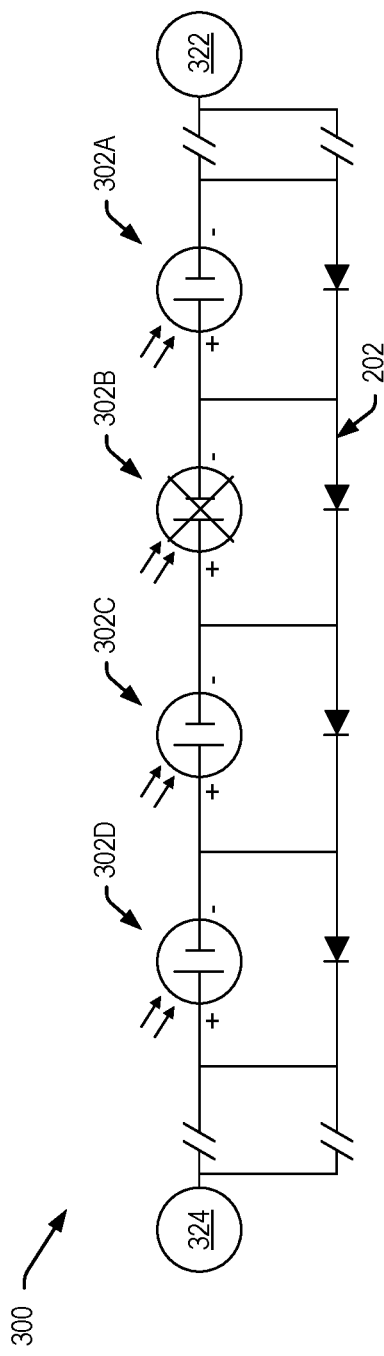
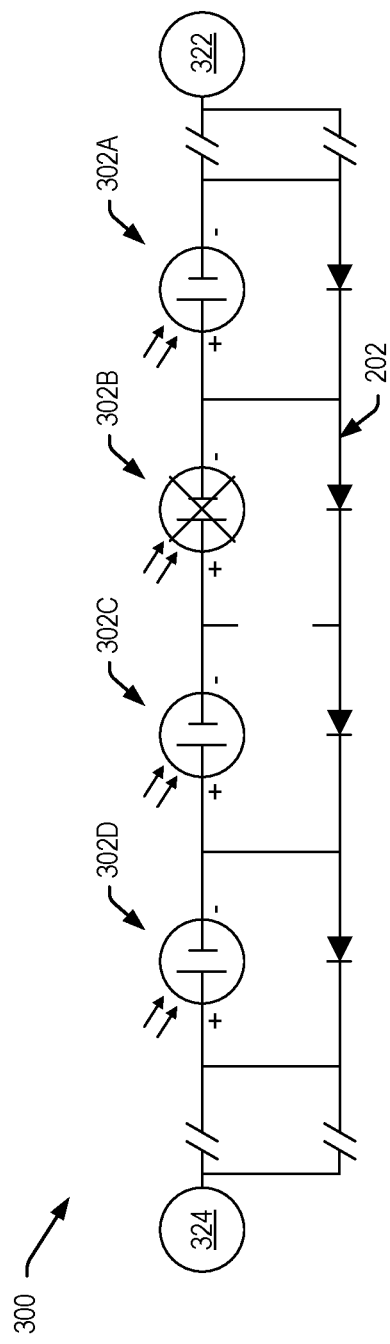
FIG. 3D
FIG. 3E

BYPASS DIODE ASSEMBLIES FOR A SOLAR CELL ARRAY

FIELD OF THE DISCLOSURE

The present disclosure is generally related to providing a bypass diode assembly for a solar cell array to limit current loss due to failure of one or more solar cells of the solar cell array electrically coupled in series.

BACKGROUND

A solar cell array includes a plurality of solar cells electrically coupled together. Some solar cells of a solar cell array are coupled together in series. For example, a row of solar cells of the solar cell array are electrically coupled in series by series interconnects, and the row may be coupled in series via one or more jumpers to an adjacent row of the solar cell array. A series connection between a first solar cell of a row and a second solar cell of the row is formed by one or more series interconnects that electrically couple a back of the first solar cell to a front of the second solar cell. The solar cells electrically coupled together in series form a solar cell string. A solar cell array typically includes a plurality of solar cell strings. Terminals of each solar cell string are electrically coupled to one or more devices that are to receive electric current generated by the solar cell string when the front of the solar cells are exposed to solar radiation.

To inhibit loss of electric current from a solar cell string due to a current limiting event such as a solar cell failure, weld failure, or a shadowing event of one or more solar cells, a bypass diode system coupled to each solar cell may be utilized to reduce an amount of current limiting of the solar cell string. A solar cell may fail due to mechanical crack formation in the solar cell; an electrical failure, which may be due to reverse bias stress of P/N junctions of one or more solar cells; loss of electrical connection of interconnects that create an open circuit; or combinations thereof. The bypass diode system for a solar cell includes a diode indirectly electrically coupled to a back of the solar cell via a diode interconnect, a parallel interconnect electrically coupled to the diode and to the back of a first adjacent solar cell, and a second parallel interconnect electrically coupled to the back of the solar cell and to a bypass diode electrically coupled to the back of a second adjacent solar cell. If a particular solar cell(s) of a solar cell string fails, the current from the previous solar cell of the solar cell string passes across the first parallel interconnect to the bypass diode, from the bypass diode to the particular solar cell through back metal of the solar cell, and across the particular solar cell through back metal coupled to the back of the particular solar cell to the next solar cell via the series interconnects and the second parallel interconnect to the next solar cell to prevent current limiting of the solar cell string.

It is possible for a situation to develop for a particular solar cell where failure of the particular solar cell due to cracking, electrical connection failure of one or more components of the bypass diode system, or both, results in an open circuit at the solar cell. In such a situation, no current would flow in the solar cell string with the particular solar cell since part of the bypass diode connection relies on the back metal of the particular solar cell.

It is desirable to have a bypass diode assembly with a reduced number of electrical connections made directly to the back metal of the solar cells of a solar cell string as compared to the number of electrical connections needed for bypass diode systems. It is also desirable to have a bypass diode assembly that does not rely on back metal of the solar cells to function in case the back metal become damaged by some mechanical failure (e.g., formation of one or more cracks).

SUMMARY

In a particular implementation, a bypass diode assembly includes a plurality of diodes and a plurality of interconnects coupled to the plurality of diodes. Each interconnect includes one or more relief features. A first terminal of a first diode of the plurality of diodes is physically and electrically coupled directly to a first end of a first interconnect of the plurality of interconnects. A second terminal of a second diode of the plurality of diodes is physically and electrically coupled directly to a second end of the first interconnect. Also, a first end of a second interconnect of the plurality of interconnects is physically and electrically coupled directly to a first terminal of the second diode.

In another particular implementation, a system includes a plurality of solar cells coupled in series to form a solar cell string. The system also includes a bypass diode assembly electrically coupled in parallel to the solar cells of the solar cell string. The bypass diode assembly includes a plurality of diodes and a plurality of interconnects coupled to the plurality of diodes. Each interconnect includes one or more relief features. Also, each interconnect is physically and electrically coupled directly to a separate solar cell of the plurality of solar cells. A first terminal of a first diode of the plurality of diodes is physically and electrically coupled directly to a first end of a first interconnect of the plurality of interconnects. A second terminal of a second diode of the plurality of diodes is physically and electrically coupled directly to a second end of the first interconnect. Also, a first end of a second interconnect of the plurality of interconnects is physically and electrically coupled directly to a first terminal of the second diode.

In another particular implementation, a method includes physically and electrically coupling a first interconnect of a bypass diode assembly to a first solar cell of a solar cell string electrically coupled in series. The bypass diode assembly includes a plurality of diodes and a plurality of interconnects coupled to the plurality of diodes. Each interconnect includes one or more relief features. A first terminal of a first diode of the plurality of diodes is physically and electrically coupled directly to a first end of the first interconnect of the plurality of interconnects. A second terminal of a second diode of the plurality of diodes is physically and electrically coupled directly to a second end of the first interconnect. Also, a first end of a second interconnect of the plurality of interconnects is physically and electrically coupled directly to a first terminal of the second diode. The method also includes physically and electrically coupling the second interconnect of the bypass diode assembly to a second solar cell of the solar cell string.

The features, functions, and advantages described herein can be achieved independently in various implementations or may be combined in yet other implementations, further details of which can be found with reference to the following description and drawings.

BRIEF DESCRIPTION OF THE DRAWINGS

FIG. 1A depicts a representation of a portion of a solar cell string with a bypass diode system coupled to each solar cell of the solar cell string, and with a failed solar cell having a failed bypass diode system.

FIG. 1B is an electrical diagram of the portion of the solar cell string depicted in FIG. 1.

FIG. 3A depicts a representation of a portion of a solar cell string with a bypass diode assembly coupled to the solar cells of the solar cell string, and with a failed solar cell.

FIG. 3B depicts a cross-sectional representation of a connection of an interconnect of a bypass diode assembly to a solar cell.

FIG. 3C depicts a cross-sectional representation of connections of a first interconnect and a second interconnect of a bypass diode assembly to a diode of the bypass diode assembly.

FIG. 3D depicts an electrical diagram of the portion of the solar cell string depicted in FIG. 1.

FIG. 3E depicts an electrical diagram of the portion of the solar cell string depicted in FIG. 1 when an electrical connection of the bypass diode assembly to a failed solar cell has failed.

DETAILED DESCRIPTION

Figure 2:
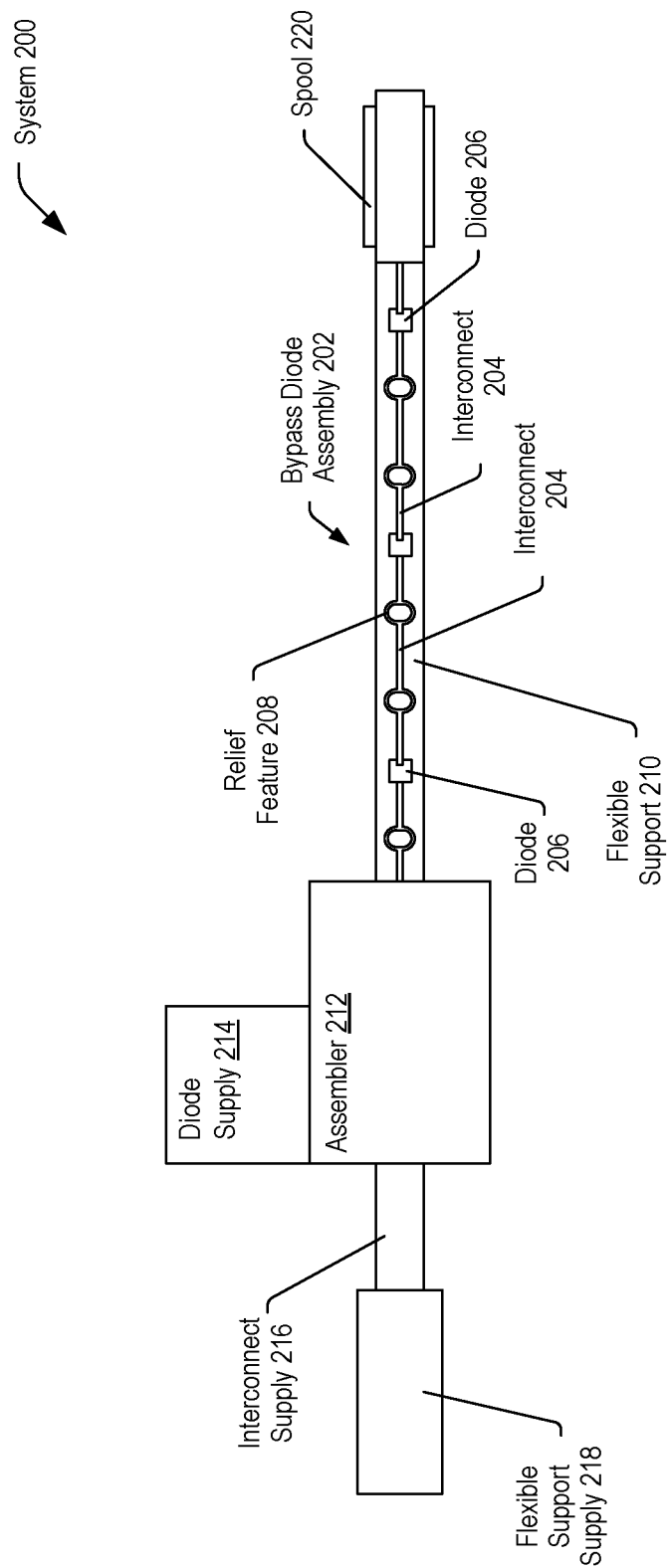
FIG. 2 depicts a block diagram of a system to produce a bypass diode assembly.

Aspects disclosed herein present systems and methods for a bypass diode assembly that requires fewer direct physical and electrical connections to solar cells of a solar cell string than bypass diode systems coupled to each solar cell. The bypass diode assembly includes a plurality of diodes physically and electrically coupled to interconnects. Each interconnect includes one or more relief features to accommodate applied forces due to deployment of the solar cell array, thermal expansion/contraction, or other causes. Electrical connections of the interconnects to the diodes may be performed by automated machinery, and the resulting bypass diode assembly may be rolled on a spool. Bypass diode systems typically used four connections (welds) to a cathode terminal of a bypass diode and four connections to an anode terminal of the bypass diode. In some implementations, the bypass diode assembly uses two connections to the cathode side of the diode and two connections to the anode side of the diode due to the diode being physically and electrically coupled directly to the interconnects and the interconnects including one or more relief features.

The spool with the bypass diode assembly may be provided to a manufacturer of solar cell arrays. Instead of individually connecting a bypass diode system to the back of each solar cell of a solar cell string, a length of the bypass assembly is unrolled from the spool, and the interconnects are physically and electrically coupled directly to the back of each solar cell of the solar cell string such that a diode is associated with each solar cell. Connections of the interconnects to the backs of the solar cells may be performed by automated machinery. A single electrical connection of the interconnect to the solar cell is needed, but additional electrical connections may be made to have one or more redundant electrical connections. When an interconnect of the bypass diode assembly is coupled to each solar cell of the solar cell string on a row of the solar cell array, the bypass diode assembly is separated from the roll by a cut across an interconnect and the cut end is electrically coupled to an appropriate connector. The portion of the bypass diode assembly unrolled from the spool may be passed through a straightener before the interconnects are electrically connected to the backs of the solar cells.

A technical advantage of use of the bypass diode assembly is that the bypass diode assembly reduces the number of parts needed to form the solar cell array as compared to using bypass diode systems coupled to each solar cell by eliminating use of diode interconnects of bypass diode systems that rely on back metal of solar cells. Another technical advantage of use of the bypass diode assembly is that the number of connections needed to be made directly to the back of a solar cell is reduced as compared to use of bypass diode systems. A minimum number of electrical connections directly to the back metal of a typical solar cell without having any redundant electrical connections for a bypass diode system is two, which includes one electrical connection of a cathode of a first diode to the back metal of the solar cell and one electrical connection of a parallel interconnect, which is electrically coupled to an anode of a second diode coupled to an adjacent solar cell, to the back metal of the solar cell. A minimum number of electrical connections directly to the back metal of the solar cell without having any redundant connections for the bypass diode assembly of the present disclosure is one electrical connection directly to the back metal of the solar cell. Use of fewer electrical connections directly to the back metal of the solar cell associated with the bypass diode assembly may result in less time needed to form a solar cell array, which can decrease production time and/or increase throughput, and may result in a lower probability of cracks developing in the solar cells due to induced stress concentrations in the solar cells caused by electrical connections made directly to the solar cells.

Failure of a particular solar cell that uses a typical bypass diode system can result in failure of an entire solar cell string that is electrically coupled in series with the failed solar cell if the bypass diode connection is also lost. Such a failure does not allow current from the operating solar cells to be diverted so that the rest of the solar cell string can provide power. Another technical advantage of the bypass diode assembly is that the bypass diode assembly does not rely on the back metal of the solar cells to complete an electrical circuit associated with solar cell string, which allows the solar cell string to continue to operate even if a particular solar cell fails and electrical connections of the bypass diode assembly directly to the back metal of the particular solar cell also fail.

The figures and the following description illustrate specific exemplary implementations. It will be appreciated that those skilled in the art will be able to devise various arrangements that, although not explicitly described or shown herein, embody the principles described herein and are included within the scope of the claims that follow this description. Furthermore, any examples described herein are intended to aid in understanding the principles of the disclosure and are to be construed as being without limitation. As a result, this disclosure is not limited to the specific embodiments or examples described below, but by the claims and their equivalents.

Particular implementations are described herein with reference to the drawings. Drawings that depict objects are representations of the objects and the objects are not drawn to scale. In the description, common features are designated by common reference numbers throughout the drawings. In some drawings, multiple instances of a particular type of feature are used. Although these features are physically and/or logically distinct, the same reference number is used for each, and the different instances are distinguished by addition of a letter to the reference number. When the features as a group or a type are referred to herein (e.g., when no particular one of the features is being referenced), the reference number is used without a distinguishing letter. However, when one particular feature of multiple features of the same type is referred to herein, the reference number is used with the distinguishing letter. For example, referring to FIG. 1A, multiple solar cells are illustrated and associated with reference numbers 102A, 102B, 102C, and 102D. When referring to a particular one of these solar cells, such as the solar cell 102A, the distinguishing letter "A" is used. However, when referring to any arbitrary one of these solar cells or to these solar cells as a group, the reference number 102 is used without a distinguishing letter.

As used herein, various terminology is used for the purpose of describing particular implementations only and is not intended to be limiting. For example, the singular forms "a," "an," and "the" are intended to include the plural forms as well, unless the context clearly indicates otherwise. Further, some features described herein are singular in some implementations and plural in other implementations. For ease of reference herein, such features are generally introduced as "one or more" features and are subsequently referred to in the singular unless aspects related to multiple of the features are being described.

The terms "comprise," "comprises," and "comprising" are used interchangeably with "include," "includes," or "including." Additionally, the term "wherein" is used interchangeably with the term "where." As used herein, "exemplary" indicates an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to a grouping of one or more elements, and the term "plurality" refers to multiple elements. As used herein, A "and/or" B may mean that either "A and B", or "A or B", or both "A and B" and "A or B" are applicable or acceptable.

As used herein, "generating," "calculating," "using," "selecting," "accessing," and "determining" are interchangeable unless context indicates otherwise. For example, "generating," "calculating," or "determining" a parameter (or a signal) can refer to actively generating, calculating, or determining the parameter (or the signal) or can refer to using, selecting, or accessing the parameter (or signal) that is already generated, such as by another component or device.

As used herein, "coupled" can include "communicatively coupled," "electrically coupled," or "physically coupled," and can also (or alternatively) include any combinations thereof. Two devices (or components) can be coupled (e.g., communicatively coupled, electrically coupled, or physically coupled) directly or indirectly via one or more other devices, components, wires, buses, networks (e.g., a wired network, a wireless network, or a combination thereof), etc. Two devices (or components) that are electrically coupled can be included in the same device or in different devices and can be connected via electronics, one or more connectors, or inductive coupling, as illustrative, non-limiting examples. In some implementations, two devices (or components) that are communicatively coupled, such as in electrical communication, can send and receive electrical signals (digital signals or analog signals) directly or indirectly, such as via one or more wires, buses, networks, etc. As used herein, "directly coupled" is used to describe two devices that are coupled (e.g., communicatively coupled, electrically coupled, or physically coupled) without intervening components. As used herein, a conductor (e.g., an interconnect) is "physically and electrically coupled" to a device (e.g., a solar cell or diode) when a portion of the conductor is in contact with the device and an electrical connection is formed between the conductor and the device via a weld, solder, or other type of electrical connection.

FIG. 1A depicts a representation of a portion of a solar cell string 100 of solar cells 102 that utilize bypass diode systems 104. Series interconnects 106 electrically couple the solar cells 102 together in series. A bypass diode system 104 is coupled to a back of each solar cell 102. Each bypass diode system 104 of a solar cell 102 includes a diode interconnect 108 physically and electrically coupled directly to the solar cell 102 near a first side 110 of the solar cell 102, a diode 112 physically and electrically coupled directly to the diode interconnect 108, a parallel interconnect 114 physically and electrically coupled directly to the diode 112 at a first end, another parallel interconnect 114 physically and electrically coupled directly to the solar cell 102 near a second side 116 of the solar cell 102, A second end of the parallel interconnect 114 near the first side 110 is physically and electrically coupled directly to the back of a previous solar cell 102 of the solar cell string 100 and the first end of the parallel interconnect 114 near the second side 116 is physically and electrically coupled directly to a diode 112 of a next solar cell 102 of the solar cell string 100.

Ends of some interconnects (e.g., diode interconnects 108 and series interconnects 106 between solar cells 102) include two tab ends at each end of the interconnect Two side by side welds, with each weld occupying a portion of the width of a tab, are used to physically and electrically couple each tab of an interconnect to a solar cell, to a diode, or to another interconnect. The two side-by-side welds that couple an interconnect to a portion of a solar cell array provide redundant electrical connections to increase a probability that the interconnect will remain electrically connected to the solar cell array.

For a particular solar cell array, formation of the bypass diode system 104 includes forming a large number of welds directly to the back of each solar cell 102 (e.g., 8 welds including four welds for a first parallel interconnect 114 near the second side 116 of the solar cell 102, and four welds to electrically connect a diode interconnect 108 to the back of the solar cell 102). In addition, the bypass diode system 104 includes four welds of the diode 112 to the diode interconnect 108, and four welds of a parallel interconnect near the first side 110 of the solar cell 102 to the diode 112. The electrical connections directly to the back metal of the solar cell may create stress concentrations that are susceptible to cracking. Failure of a bypass diode system at a particular solar cell 102 (e.g., due to one or more cracks of the solar cell 102 that inhibit electrical current across the solar cell 102, due to failure of the welds of a parallel interconnect 114 to the solar cell 102 near the second side 116 of the solar cell 102, etc.) can result in loss of the current associated with the solar cell string 100.

A solar cell 102 can develop one or more cracks that create an open circuit in a solar cell string 100. In FIG. 1A, solar cell 102A has two cracks 118A, 118B that create an open circuit in the solar cell string 100. The bypass diode system 104A allows current received at the diode 112A via the parallel interconnect 114 near the first side 110 from a previous portion of the solar cell string 100 to pass to the back metal of the solar cell 102A, and pass through the parallel interconnect 114 near the second side 116 to the next solar cell 102B. If all subsequent solar cells 102 of the solar cell system are functional, or the subsequent solar cells include one or more failed solar cells with functional bypass diode systems 104, the solar cell string 100 will provide a current to a device coupled to the solar cell string 100.

For some solar cell arrays, one or more failed solar cells 102 of a solar cell string 100 that create open circuits can include a failed bypass diode system 104, which results in the solar cell string 100 not providing current to a device coupled to the solar cell string 100. A bypass diode system 104 can fail if electrical connections to the solar cell 102 separate from the solar cell 102 creating an open circuit or if one or more cracks 118 develop in the solar cell 102 that prevent current flow to the series interconnects 106 to the next solar cell and that prevent current flow to the parallel interconnect 114 near the second side 116 of the solar cell 102 to the next solar cell 102.

In FIG. 1A, solar cell 102B is a failed solar cell that includes a crack 118. The crack 118 creates an open circuit. The crack 118 also prevents the bypass diode system 104B from working since the location of the crack 118 prevents current from solar cell 102A from passing to the solar cell 102C via the bypass diode system 104B and the series interconnects 304.

FIG. 1B depicts an electrical diagram that represents the solar cell string 100 of FIG. 1A when the solar cell string 100 is coupled to a first terminal 126 and a second terminal 128 of a device to receive current from the solar cell string 100. No current from the solar cell string 100 flows to the second terminal 128 because of the failure of the solar cell 102B and the failure of the bypass diode system 104B of the solar cell 102B.

FIG. 2 depicts a block diagram of a system 200 to produce bypass diode assemblies 202. A bypass diode assembly 202 includes a plurality of interconnects 204 and a plurality of diodes 206 physically and electrically coupled directly to the interconnects 204. Each interconnect 204 includes one or more relief features 208 to accommodate bending, thermal expansion/contraction, other forces, or combinations thereof, applied to the bypass diode assembly 202. The interconnects 204 depicted in FIG. 2 include two relief features 208. In other implementations, the interconnects 204 may include a single relief feature 208 or more than two relief features 208. The bypass diode assembly 202 may be coupled to a flexible support 210 (e.g., a polymer film).

The system 200 includes an assembler 212, a diode supply 214, an interconnect supply 216, and a flexible support supply 218. In some implementations, the bypass diode assembly 202 is not coupled to a flexible support 210, and the system 200 does not include a flexible support supply 218. When a flexible support 210 is used, the flexible support supply 218 includes a roll of flexible support material. The interconnect supply 216 includes a roll of interconnect material, and the assembler 212 may cut individual interconnects 204 from the roll of interconnect material as needed, or the interconnect supply may have a plurality of separate interconnects 204.

In an implementation, the assembler 212 physically and electrically couples (e.g., welds) a first end of a first interconnect 204 to an anode terminal of a first diode 206 of the plurality of diodes 206. For example, the assembler 212 may form two side-by-side welds to couple the first interconnect 204 to the anode terminal of the first diode 206. In other implementations, the assembler uses one weld or more than two side-by-side welds to couple the first interconnect 204 to the anode terminal of the first diode 206. Each diode 206 may include indicia on one or more surfaces that indicate an anode terminal of the diode 206, a cathode terminal of the diode 206, or both. The assembler 212 physically and electrically couples a second end of the first interconnect 204 to a cathode terminal of a second diode 206. For example, the assembler 212 may form two side-by-side welds to couple the second end of the first interconnect 204 to the cathode terminal of the second diode 206. In other implementations, the assembler 212 uses one weld or more than two side-by-side welds to couple the first interconnect 204 to the cathode terminal of the second diode 206. The assembler 212 continues to form the bypass diode assembly 202 by physically and electrically coupling a first end of a second interconnect 204 to the anode terminal of the second diode 206. The assembler 212 continues to chain interconnects 204 to the diodes 206 until a desired length of the bypass diode assembly 202 is produced.

As the assembler 212 produces portions of bypass diode assembly 202, the assembler 212 attaches the portions to the flexible support 210. Indicia on the flexible support 210, indicia on the diodes 206, indicia on a back surface of a solar cell string 100, or combinations thereof, are utilized to orient the bypass diode assembly 202 in a correct direction when the bypass diode assembly 202 is coupled to a solar cell array. After, or before, coupling of the bypass diode assembly 202 to the solar cell array, the flexible support 210 may be removed. A bypass diode assembly 202 produced by the assembler 212 is rolled onto a spool 220 and the spool 220 is supplied to a solar cell array manufacturer.

FIG. 3A depicts the bypass diode assembly 202 physically and electrically coupled to a portion of a row of solar cells 302 of a solar cell string 300. Series interconnects 304 couple each solar cell 302 to an adjacent solar cell 302.

In some implementations, an automated system is used to couple the bypass diode assembly 202 to a row of solar cells 302 of a solar cell string 300 of a solar cell array. A portion of the bypass diode assembly 202 is unrolled from the spool 220. The portion may be passed through a straightener. The orientation of the bypass diode assembly 202 relative to the row of solar cells 302 is checked; and if not correct, the orientation is changed to the correct orientation. When the bypass diode assembly 202 is in the correct orientation, each interconnect 204 of the bypass diode assembly 202 is physically and electrically coupled (welded) to a solar cell 302 of the row. For each interconnect 204, two side-by-side welds along a width of the interconnect 204 may be used to physically and electrically couple each interconnect 204 to a particular solar cell 302. In some implementations, a single physical and electrical connection is made directly between the interconnect 204 and the particular solar cell 302 across a width of the interconnect 204 and/or one or more additional redundant physical and electrical connections of the interconnect 204 directly to the particular solar cell 302 are made. After, or before, physically and electrically coupling the interconnects 204 to the solar cells 302, the flexible support 210 may be removed.

In some implementations, an interconnect 204 is physically and electrically coupled directly to a solar cell 302 at one or more places near a location 306 between relief features 208 of the interconnect 204. The one or more places may be located close to a side 308 of the solar cell 302 with series interconnects 304 to a next solar cell 302 of the solar cell string 300 to reduce a probability of a crack that causes failure of the solar cell 302 developing between the side 308 and the physical and electrical connection of the bypass diode assembly 202 directly to the solar cell 302. In other implementations, an interconnect 204 is physically and electrically connected directly to the solar cell 302 at one or more places near a location 310 between the side 308 and a relief feature 208 of the interconnect 204. In other implementations, an interconnect 204 is physically and electrically connected directly to the solar cell 302 at one or more places near a location 312 between a relief feature 208 and a diode 206 associated with the solar cell 302. The physical and electrical connection of the interconnect 204 directly to the solar cell 302 includes a primary weld and may include one or more additional redundant welds.

A portion of a bypass diode assembly 202 associated with and coupled to a solar cell 302 with redundant physical and electrical connections may include a total of six welds with two of the welds being directly made to the solar cell (e.g., two welds to physically and electrically couple an interconnect 204 directly to the solar cell 302, two welds that electrically connect a first end of the interconnect 204 to a diode 206 associated with the solar cell 302, and two welds that electrically connect a second end of the interconnect 204 to a second diode associated with another solar cell 302). The number of welds is less than the number of welds needed to couple a bypass diode system to a solar cell 102 with redundant electrical connections.

The solar cell 302B includes a crack 314 across the solar cell 302B. The crack 314 would prevent the solar cell 302B from generating electricity when the front of the solar cell 302B is exposed to solar radiation. The bypass diode assembly 202 is physically and electrically coupled to the solar cell 302B at one or more places near location 306 such that current carried by the bypass diode assembly 202 passes to the solar cell 302B and passes across the series interconnects 304 to the solar cell 302C.

FIG. 3B depicts a cross-sectional representation of physical and electrical connections of an interconnect 204 to a solar cell 302. The back of the solar cell 302 includes a back metal surface 316. A pair of welds 318 physically and electrically couple the interconnect 204 directly to the back metal surface 316. A first weld 318 of the pair of welds 318 is a primary electrical connection, and the other weld 318 of the pair of welds 318 is a redundant electrical connection. In other implementations, a single weld may be used to couple the interconnect 204 to the back metal surface 316. In some implementations, the interconnect 204 may be coupled to the back metal surface 316 at one location. In other implementations, the interconnect 204 may be coupled to the metal surface 316 at multiple locations to provide redundancy.

FIG. 3C depicts a cross-sectional representation of physical and electrical connections of interconnects 204 directly to terminals of a diode 206. A first pair of welds 318A physically and electrically connect a first interconnect 204A directly to a first terminal 320A (anode terminal or cathode terminal) of the diode 206. A second pair of welds 318B physically and electrically connect a second interconnect 204B directly to a second terminal 320B (cathode terminal or anode terminal) of the diode 206.

FIG. 3D depicts an electrical diagram that represents the solar cell string 300 of FIG. 3A when the solar cell string 300 is coupled to a first terminal 322 and a second terminal 324 of a device to receive current from the solar cell string 300. Solar cell 302B is a failed solar cell (e.g., solar cell 302B includes one or more cracks that create an open circuit). Current from the bypass diode assembly 202 passes to the solar cell 302B through the physical and electrical connection of the interconnect 204 directly to the solar cell 302B. The current passes through the series interconnects 304 to the solar cell 302C, and the solar cell string 300 provides current to the terminal 324 without a contribution from solar cell 302B. The bypass diode assembly 202 limits power loss of the solar cell string 300 when one or more of the solar cells 302 of the plurality of solar cells are not functional. The diode 206 depicted in FIG. 3C has an anode terminal on a first side of the diode 206 and a cathode terminal on a second side of the diode. In other implementations, the anode terminal and the cathode terminal may be located on the same side of the diode 206.

FIG. 3E depicts an electrical diagram that represents the solar cell string 300 of FIG. 3A when the solar cell string 300 is coupled to a first terminal 322 and a second terminal 324 of a device to receive current from the solar cell string 300. In FIG. 3E, solar cell 302B is a failed solar cell (e.g., solar cell 302B includes one or more cracks that create an open circuit) and an electrical connection of the bypass diode assembly 202 to the solar cell 302B has failed. Failure of the electrical connection of the bypass diode assembly 202 to the solar cell 302B could occur if the physical and electrical connections of the interconnect 204 directly to the solar cell 302B fail or if one or more cracks that cause failure of the solar cell 302B prevent current provided by the bypass diode assembly 202 from the interconnect 204 electrically coupled to the solar cell 302B from passing through the series interconnects 304 to the solar cell 302C. In this situation, no current is provided to the solar cell 302C through the series interconnects 304, so electricity contribution from solar cell 302B and solar cell 302C to the solar cell string 300 is lost, but the other solar cells 302 of the solar cell string 300 contribute electricity to the solar cell string 300 so that the terminal 324 receives current from the solar cell string 300. The bypass diode assembly 202 limits power loss of the solar cell string 300 when one or more of the solar cells 302 of the solar cell string 300 are not functional and one or more interconnects 204 to a failed solar cell are not functional to enable current to pass to a next solar cell 302 of the solar cell string 300. As a comparison, the solar cell string 100 of FIG. 1A that utilizes bypass diode systems 104 would have a complete power loss since solar cell 102B of the solar cell string 100 failed and a connection of the bypass diode system 104 is not functional to enable current to pass to a next solar cell 102 of the solar cell string 100.

Figure 4:
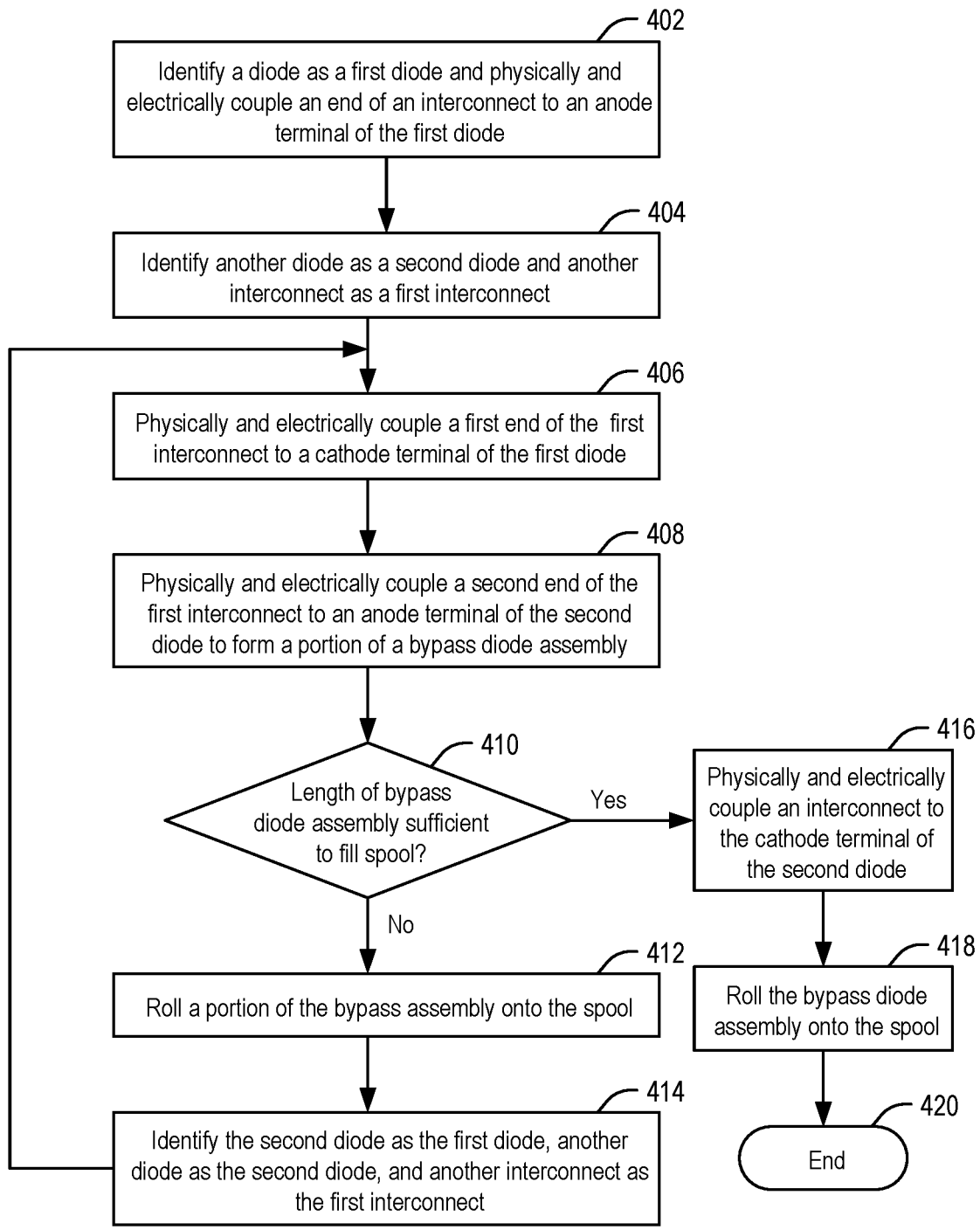
FIG. 4 is a flow chart of a method to produce a bypass diode assembly.

FIG. 4 depicts a flowchart of an implementation of a method 400 of forming a bypass diode assembly. The bypass diode assembly may be the bypass diode assembly 202 depicted in FIG. 2 and FIG. 3A and the method 400 may be performed by the assembler 212 of FIG. 2. The method 400, at block 402, includes identifying a diode 206 as a first diode 206 and physically and electrically coupling an end of an interconnect 204 to an anode terminal of the first diode 206. The first diode 206 may be a diode 206 from the diode supply 214 and the interconnect 204 may be cut from a roll of joined interconnects of the interconnect supply 216. The method 400, at block 404, includes identifying another diode 206 as a second diode 206 and another interconnect 204 as a first interconnect 204. The second diode 206 may be a next diode 206 obtained from the diode supply 214 and the first interconnect 204 may be another interconnect 204 cut from the roll of joined interconnects.

The method 400, at block 406, includes physically and electrically coupling a first end of the first interconnect 204 to a cathode terminal of the first diode 206. The method 400, at block 408 includes physically and electrically coupling a second end of the first interconnect 204 to an anode terminal of the second diode to form a portion of the bypass diode assembly 202.

The method 400, at decision block 410, determines whether a length of the bypass assembly is sufficient to fill a spool 220. When the determination at decision block 410 is that the length of the bypass diode assembly 202 is not sufficient to fill the spool 220, the method 400, at block 412, includes rolling a portion of the bypass assembly onto the spool 220. The method 400, at block 414, also includes identifying the second diode 206 as the first diode 206 and another interconnect 204 as the first interconnect. The method 400, then returns to block 406.

When the determination at decision block 410 is that the length of the bypass diode assembly 202 is sufficient to fill the spool 220, the method 400, at block 416, includes physically and electrically coupling an interconnect 204 to the cathode terminal of the second diode 206. The method 400, at block 418, includes rolling the bypass diode assembly onto the spool 220. The method 400, then ends at block 420.

Figure 5:
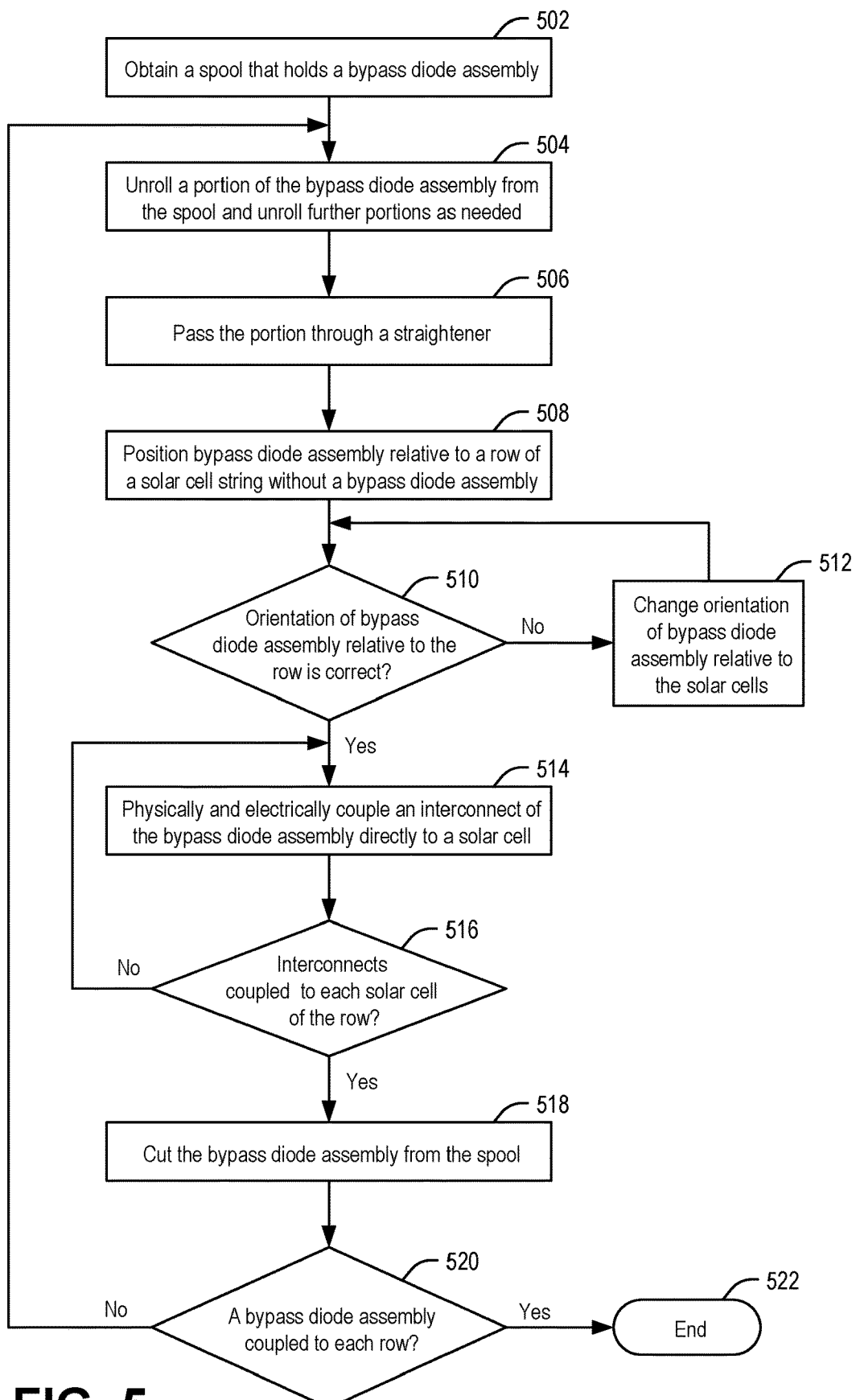
FIG. 5 is a flow chart of a method to couple a bypass diode assembly to a solar cell string.

FIG. 5 depicts a flowchart of an implementation of a method 500 to couple a bypass diode assembly to a row of solar cells of a solar cell string of a solar cell array. The bypass diode assembly may be the bypass diode assembly 202 depicted in FIG. 2 and FIG. 3A. For example, the bypass diode assembly may be produced by the assembler 212 of FIG. 2 or by another system using the method 400 of FIG. 4. The method 500, at block 502, includes obtaining a spool 220 that holds a bypass diode assembly 202.

The method 500, at block 504, includes unrolling a portion of the bypass diode assembly 202 from the spool 220 and unrolling further portions of the bypass diode assembly 202 from the spool 220 as needed. The spool 220 may be positioned in working relation to a solar cell array that the bypass diode assembly 202 is to be connected to. The method 500, at block 506, includes passing the portion through a straightener. The straightener may at least partially remove residual stresses in the bypass diode assembly 202 that act to curl the bypass diode assembly 202. The method 500, at block 508, includes positioning the portion of the bypass diode assembly 202 relative to a row of a solar cell string 300 of the solar cell array without a bypass diode assembly.

The method 500, at decision block 510, includes determining whether an orientation of the bypass diode assembly 202 relative to the row is correct. When the decision at decision block 510 is that the orientation of the bypass diode assembly 202 relative to the row is not correct, the method 500, at block 512, includes changing the orientation of the bypass diode assembly 202 relative to the solar cells and returning to decision block 510.

When the decision at decision block 510 is that the orientation of the bypass diode assembly 202 relative to the row is correct, the method 500, at block 514 includes physically and electrically coupling an interconnect 204 of the bypass diode assembly 202 directly to a solar cell 302. Physically and electrically coupling the interconnect 204 directly to the solar cell 302 may include forming one or more welds 318 between the interconnect 204 and the solar cell 302.

The method 500, at decision block 516, includes determining whether an interconnect 204 is coupled to each solar cell 302 of the row. When the determination at decision block 516 is that one or more solar cells 302 of the row are not coupled to an interconnect 204, the method 500 returns to block 514. When the determination at decision block 516 is that an interconnect 204 is coupled to each solar cell 302, the method 500, at block 518, includes cutting the bypass diode assembly 202 from the spool 220. Cutting the bypass diode assembly 202 may include cutting the bypass diode assembly 202 across an interconnect 204 to separate the bypass diode assembly 202 coupled to the row from the remaining bypass diode assembly 202 on the spool 220.

The method 500, at decision block 520, includes determining whether a bypass diode assembly 202 is coupled to each row of the solar cell string 300 of the solar cell array. When the determination at decision block 520 is that a bypass diode assembly 202 is not coupled to each row, the method 500, returns to block 504. When the determination at decision block 520 is that a bypass assembly is coupled to each row, the method ends at block 522.

Methods 400, 500 present particular ways to make and use bypass assemblies 202 and other ways to make and use bypass assemblies 202 can be employed. Also, all blocks of methods 400, 500 do not need to be performed and/or an order of the blocks can be changed. For example, for method 500, a length of bypass assembly 202 with a number of diodes 206 to accommodate the number of solar cells 300 of a solar cell row may be unwound and cut from the spool 220 before physically and electrically coupling the bypass diode assembly 202 to the row, in which case, block 518 would occur between block 506 and block 508.

Particular aspects of the disclosure are described below in sets of interrelated Examples:

According to Example 1, a bypass diode assembly includes: a plurality of diodes; and a plurality of interconnects coupled to the plurality of diodes, wherein each interconnect includes one or more relief features, and wherein: a first terminal of a first diode of the plurality of diodes is physically and electrically coupled directly to a first end of a first interconnect of the plurality of interconnects; a second terminal of a second diode of the plurality of diodes is physically and electrically coupled directly to a second end of the first interconnect; and a first end of a second interconnect of the plurality of interconnects is physically and electrically coupled directly to a first terminal of the second diode.

Example 2 includes the bypass diode assembly of Example 1, wherein a pair of welds physically and electrically couple the first end of the first interconnect to the first terminal of the first diode.

Example 3 includes the bypass diode assembly of Example 1 or Example 2, wherein a pair of welds physically and electrically couple the second end of the first interconnect to the second terminal of the second diode.

Example 4 includes the bypass diode assembly of any of Example 1 to Example 3, wherein the first interconnect is configured to be physically and electrically connected to a metal surface of a first solar cell of a string of solar cells electrically coupled in series, and wherein the second interconnect is configured to be physically and electrically connected to a metal surface of a second solar cell of the string of solar cells.

Example 5 includes the bypass diode assembly of Example 4, wherein the first interconnect is configured to be physically and electrically connected to the metal surface of the first solar cell by one or more pairs of welds.

Example 6 includes the bypass diode assembly of Example 4 or Example 5, wherein the first interconnect includes a first relief feature of the one or more relief features and a second relief feature of the one or more relief features, and wherein a physical and electrical connection to the first solar cell is made at a position between the first relief feature and the second relief feature.

Example 7 includes the bypass diode assembly of any of Example 4 to Example 6, wherein the plurality of diodes and the plurality of interconnects are rolled on a spool and configured such that the first interconnect can be unrolled from the spool and physically and electrically connected to the first solar cell and subsequently, the second interconnect can be unrolled from the spool and physically and electrically connected to the second solar cell.

Example 8 includes the bypass diode assembly of any of Example 4 to Example 7, wherein a physical and electrical connection of the first interconnect to the first solar cell is made at a position on the first interconnect between the first diode and a relief feature of the first interconnect closest to the first diode.

Example 9 includes the bypass diode assembly of any of Example 4 to Example 6, wherein a physical and electrical connection of the first interconnect to the first solar cell is made at a position on the first interconnect between the second diode and a relief feature of the first interconnect closest to the second diode.

Example 10 includes the bypass diode assembly of any of Example 1 to Example 9, further including a support coupled to the plurality of diodes and the plurality of interconnects.

According to Example 11, a system includes: a plurality of solar cells electrically coupled in series to form a solar cell string; and a bypass diode assembly electrically coupled in parallel to the solar cells of the solar cell string, wherein the bypass diode assembly includes: a plurality of diodes; and a plurality of interconnects coupled to the plurality of diodes, wherein each interconnect includes one or more relief features, wherein each interconnect is physically and electrically coupled directly to a separate solar cell of the plurality of solar cells, and wherein: a first terminal of a first diode of the plurality of diodes is physically and electrically coupled directly to a first end of a first interconnect of the plurality of interconnects; a second terminal of a second diode of the plurality of diodes is physically and electrically coupled directly to a second end of the first interconnect; and a first end of a second interconnect of the plurality of interconnects is physically and electrically coupled directly to a first terminal of the second diode.

Example 12 includes the system of Example 11, wherein one or more of the diodes of the plurality of diodes enable current flow through a portion of the bypass diode assembly to limit power loss of the solar cell string when one or more of the solar cells of the plurality of solar cells are failed solar cells.

Example 13 includes the system of Example 11 or Example 12, wherein each interconnect is physically and electrically coupled to a solar cell at multiple locations to provide one or more redundant electrical connections for each interconnect.

Example 14 includes the system of any of Example 11 to Example 13, wherein the first diode of the bypass diode assembly is physically and electrically coupled to the first interconnect of the plurality of interconnects at multiple locations to provide one or more redundant electrical connections between the first diode and the first interconnect, and wherein the first diode is physically and electrically coupled to a second interconnect of the plurality of interconnects at multiple locations to provide one or more redundant electrical connections between the first diode and the second interconnect.

Example 15 includes the system of any of Example 11 to Example 14, wherein the bypass diode assembly is configured to limit power loss due to failure of one or more solar cells of the solar cell string when an electrical connection of a particular interconnect to a failed solar cell does not enable current provided to the failed solar cell to pass to the next solar cell of the solar cell string.

Example 16 includes the system of any of Example 11 to Example 15 wherein the bypass diode assembly is the bypass diode assembly of any of Example 1 to Example 10.

According to Example 17, a method includes: physically and electrically coupling a first interconnect of a bypass diode assembly directly to a first solar cell of a solar cell string electrically coupled in series, wherein the bypass diode assembly includes: a plurality of diodes; and a plurality of interconnects coupled to the plurality of diodes, wherein each interconnect includes one or more relief features, and wherein: a first terminal of a first diode of the plurality of diodes is physically and electrically coupled directly to a first end of the first interconnect of the plurality of interconnects; a second terminal of a second diode of the plurality of diodes is physically and electrically coupled directly to a second end of the first interconnect; and a first end of a second interconnect of the plurality of interconnects is physically and electrically coupled directly to a first terminal of the second diode; and physically and electrically coupling the second interconnect of the bypass diode assembly directly to a second solar cell of the solar cell string.

Example 18 includes the method of Example 17 further including unrolling a portion of the bypass diode assembly from a roll to position the first interconnect in working relation to the first solar cell.

Example 19 includes the method of Example 17 or Example 18 further including passing a portion of the bypass diode assembly unrolled from a roll through a straightener to at least partially remove residual stresses in the bypass diode assembly that act to curl the bypass diode assembly.

Example 20 includes the method of any of Example 17 to Example 19 further including physically and electrically coupling a last interconnect of the bypass diode assembly to an end solar cell of the solar cell string; and cutting the bypass diode assembly across an interconnect between the roll and a location of a connection of the last interconnect to the end solar cell.

Example 21 includes the method of any of Example 17 to Example 20, wherein said physically and electrically coupling the first interconnect of a bypass diode assembly to the first solar cell includes welding the first interconnect to the first solar cell at multiple locations to have one or more redundant electrical connections between the first interconnect and the first solar cell.

Example 22 includes the method of any of Example 17 to Example 21 wherein the bypass diode assembly is the bypass diode assembly of any of Example 1 to Example 10.

The illustrations of the examples described herein are intended to provide a general understanding of the structure of the various implementations. The illustrations are not intended to serve as a complete description of all of the elements and features of apparatus and systems that utilize the structures or methods described herein. Many other implementations may be apparent to those of skill in the art upon reviewing the disclosure. Other implementations may be utilized and derived from the disclosure, such that structural and logical substitutions and changes may be made without departing from the scope of the disclosure. For example, method operations may be performed in a different order than shown in the figures or one or more method operations may be omitted. Accordingly, the disclosure and the figures are to be regarded as illustrative rather than restrictive.

Moreover, although specific examples have been illustrated and described herein, it should be appreciated that any subsequent arrangement designed to achieve the same or similar results may be substituted for the specific implementations shown. This disclosure is intended to cover any and all subsequent adaptations or variations of various implementations. Combinations of the above implementations, and other implementations not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single implementation for the purpose of streamlining the disclosure. Examples described above illustrate but do not limit the disclosure. It should also be understood that numerous modifications and variations are possible in accordance with the principles of the present disclosure. As the following claims reflect, the claimed subject matter may be directed to less than all of the features of any of the disclosed examples. Accordingly, the scope of the disclosure is defined by the following claims and their equivalents.

What is claimed is:

1. A system comprising:
  a plurality of solar cells electrically coupled in series as a solar cell string by a plurality of series interconnects, wherein a series interconnect of the plurality of series interconnects is electrically connected directly to a back of a solar cell of the solar cell string and a front of an adjacent solar cell of the solar cell string; and
  a bypass diode assembly electrically coupled in parallel to backs of the solar cells of the solar cell string, the bypass diode assembly comprising:
    a plurality of diodes; and
    a plurality of interconnects coupled to the plurality of diodes, wherein each interconnect includes a first end, a second end, and two relief features between the first end and the second end, and wherein:
      a first terminal of a first diode of the plurality of diodes is physically and electrically coupled directly to the first end of a first interconnect of the plurality of interconnects;
      a second terminal of a second diode of the plurality of diodes is physically and electrically coupled directly to the second end of the first interconnect;
      the first end of a second interconnect of the plurality of interconnects is physically and electrically coupled directly to a first terminal of the second diode; and
      each interconnect of the plurality of interconnects is physically and electrically coupled directly to a back of a single solar cell of the solar cell string at one or more positions along a length of the interconnect that connects the first end to the second end.

2. The system of claim 1, wherein a pair of welds physically and electrically couple the first end of the first interconnect to the first terminal of the first diode.

3. The system of claim 1, wherein a pair of welds physically and electrically couple the second end of the first interconnect to the second terminal of the second diode.

4. The system of claim 1, wherein the back of a first solar cell of the solar cell string is a metal surface, and wherein the two relief features include a first relief feature and a second relief feature.

5. The system of claim 4, wherein the first interconnect is configured to be physically and electrically connected to the metal surface of the first solar cell by one or more pairs of welds.

6. The system of claim 4, wherein a physical and electrical connection to the first solar cell is made at a position between the first relief feature and the second relief feature.

7. The system of claim 4, wherein the plurality of diodes and the plurality of interconnects are rolled on a spool and configured such that the first interconnect can be unrolled from the spool and physically and electrically connected to the first solar cell and subsequently, the second interconnect can be unrolled from the spool and physically and electrically connected to a second solar cell of the solar cell string.

8. The system of claim 4, wherein a physical and electrical connection of the first interconnect to the first solar cell is made at a position on the first interconnect between the first diode and the first relief feature.

9. The system of claim 4, wherein a physical and electrical connection of the first interconnect to the first solar cell is made at a position on the first interconnect between the second diode and the second relief feature.

10. The system of claim 1, further comprising a support coupled to the plurality of diodes and the plurality of interconnects.

11. A system comprising:
  a plurality of solar cells electrically coupled in series to form a solar cell string; and
  a bypass diode assembly electrically coupled in parallel to the solar cells of the solar cell string, wherein the bypass diode assembly includes:
    a plurality of diodes; and
    a plurality of interconnects coupled to the plurality of diodes, wherein each interconnect includes a first end, a first portion that extends in a first direction from the first end to a start of a first relief feature, a second portion that extends in the first direction from an end of the first relief feature to a start of a second relief feature, and a third portion that extends in the first direction from an end of the second relief feature to a second end, and wherein:
      a first terminal of a first diode of the plurality of diodes is physically and electrically coupled directly to a first interconnect of the plurality of interconnects adjacent to the first end of the first interconnect;
      a second terminal of a second diode of the plurality of diodes is physically and electrically coupled directly to the first interconnect adjacent to the second end of the first interconnect;
      a second interconnect of the plurality of interconnects is physically and electrically coupled directly to a first terminal of the second diode adjacent to the first end of the second interconnect;
      a physical and electrical connection connects the first interconnect to a metal surface of a first solar cell of the plurality of solar cells, the physical and electrical connection connected to the first interconnect at a location on the second portion of the first interconnect; and
      each interconnect of the plurality of interconnects is physically and electrically coupled directly to only a single solar cell of the plurality of solar cells at one or more positions along a length of the interconnect that connects the first end to the second end.

12. The system of claim 11, wherein one or more of the diodes of the plurality of diodes enable current flow through a portion of the bypass diode assembly to limit power loss of the solar cell string when one or more of the solar cells of the solar cell string are failed solar cells.

13. The system of claim 11, wherein the first interconnect is physically and electrically connected to the first solar cell at multiple locations to provide one or more redundant electrical connections for the first interconnect.

14. The system of claim 11, wherein the first diode of the bypass diode assembly is physically and electrically coupled to the first interconnect of the plurality of interconnects at multiple locations to provide one or more redundant electrical connections between the first diode and the first interconnect, and wherein the first diode is physically and electrically coupled to the second interconnect of the plurality of interconnects at multiple locations to provide one or more redundant electrical connections between the first diode and the second interconnect.

15. The system of claim 11, wherein the bypass diode assembly is configured to limit power loss due to failure of one or more solar cells of the solar cell string when an electrical connection of a particular interconnect to a failed solar cell does not enable current provided to the failed solar cell to pass to the next solar cell of the solar cell string.

16. A method comprising:
physically and electrically coupling a first interconnect of a bypass diode assembly directly to a first solar cell of a solar cell string electrically coupled in series, wherein the bypass diode assembly includes:
a plurality of diodes; and
a plurality of interconnects coupled to the plurality of diodes, wherein each interconnect includes a first end, a first portion that extends in a first direction from the first end to a start of a first relief feature, a second portion that extends in the first direction from an end of the first relief feature to a start of a second relief feature, and a third portion that extends in the first direction from an end of the second relief feature to a second end, and wherein:
a first terminal of a first diode of the plurality of diodes is physically and electrically coupled directly to the first interconnect of the plurality of interconnects adjacent to the first end of the first interconnect;
a second terminal of a second diode of the plurality of diodes is physically and electrically coupled directly to the first interconnect adjacent to the second end of the first interconnect;
the first end of a second interconnect of the plurality of interconnects is physically and electrically coupled directly to a first terminal of the second diode; and
the first interconnect is physically and electrically coupled directly to only the first solar cell of the solar cell string at one or more positions along a length of the first interconnect that connects the first end to the second end; and
physically and electrically coupling the second interconnect of the bypass diode assembly directly to only a second solar cell of the solar cell string at one or more positions along a length of the second interconnect that connects the first end of the second interconnect to the second end of the second interconnect.

17. The method of claim 16, further comprising unrolling a portion of the bypass diode assembly from a roll to position the first interconnect in working relation to the first solar cell.

18. The method of claim 17, further comprising passing a portion of the bypass diode assembly unrolled from the roll through a straightener to at least partially remove residual stresses in the bypass diode assembly that act to curl the bypass diode assembly.

19. The method of claim 17, further comprising:
physically and electrically coupling a last interconnect of the bypass diode assembly to an end solar cell of the solar cell string; and
cutting the bypass diode assembly across an interconnect between the roll and a location of a connection of the last interconnect to the end solar cell.

20. The method of claim 16, wherein said physically and electrically coupling the first interconnect of the bypass diode assembly to the first solar cell includes welding the first interconnect to the first solar cell at multiple locations to have one or more redundant electrical connections between the first interconnect and the first solar cell.

* * * * *